United States Patent
Peng et al.

(10) Patent No.: US 6,440,859 B1
(45) Date of Patent: Aug. 27, 2002

(54) METHOD FOR ETCHING PASSIVATION LAYER OF WAFER

(75) Inventors: Jun-Kai Peng, Hsin-Chu; Wei-Kun Yeh; Chiarn-Lung Lee, both of Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 239 days.

(21) Appl. No.: 09/160,964

(22) Filed: Sep. 25, 1998

(51) Int. Cl.[7] ............................................. H01L 21/311
(52) U.S. Cl. ..................................... 438/700; 438/704
(58) Field of Search ................................. 438/691, 694, 438/700, 704, 745, 759, 958

(56) References Cited

U.S. PATENT DOCUMENTS

| | | | |
|---|---|---|---|
| 5,119,171 A | * 6/1992 | Lesk et al. .................... 357/70 |
| 5,246,883 A | 9/1993 | Lin et al. ..................... 437/195 |
| 5,380,401 A | 1/1995 | Jones et al. .................. 156/665 |
| 5,445,994 A | 8/1995 | Gilton ......................... 437/183 |
| 5,565,378 A | 10/1996 | Harada et al. ............... 437/182 |
| 5,593,927 A | * 1/1997 | Farnworth et al. .......... 437/209 |
| 5,731,243 A | * 3/1998 | Peng et al. .................. 438/612 |
| 5,874,317 A | * 2/1999 | Stolmeijer .................... 437/67 |

* cited by examiner

*Primary Examiner*—Benjamin L. Utech
*Assistant Examiner*—Kim-Chan Chen
(74) *Attorney, Agent, or Firm*—George O. Saile; Stephen B. Ackerman; William Robertson

(57) ABSTRACT

In an improved method for etching a groove n the uppermost layer of a semiconductor wafer, a conventional anisotropic etch is performed to achieve a narrow groove and an isotropic etch is performed to widen the groove at the device surface and thereby round the edges where the walls of the groove meet the surface of the wafer. During a later step of applying a protective tape to the device side of the wafer to protect it during a step of grinding the back of the wafer, the rounded edges of the groove are unlikely to cut through the adhesive layer of the tape and thereby cause particles of adhesive to remain on the wafer surface when the tape is removes.

7 Claims, 1 Drawing Sheet

METHOD FOR ETCHING PASSIVATION LAYER OF WAFER

FIELD OF THE INVENTION

This invention relates generally to semiconductor wafers and more specifically to an improved method for etching a passivation layer of the wafer.

Introduction

In a familiar process for manufacturing semiconductor chips, an ingot of silicon is formed and then is cut into thin circular wafers. One surface of a wafer will later have devices formed on it and this side of the wafer is called the device side. The other surface of the wafer is called the back side (or the back).

After the steps for forming the devices have been completed and before the wafer is broken along scribe lines to separate the individual chips, the back side of the wafer is ground to give the wafer a thickness of, for example, 300 microns to 380 microns (from a starting Thickness of for example 680 microns). The additional wafer thickness during the device forming steps gives the wafer strength to keep the wafer from breaking during handling.

A protective tape, called a grinding tape, is put on the device side of the wafer to protect the device surface while the back side is being ground. The grinding tape commonly has a plastic adhesive layer formed on a backing of a suitable material.

After the operation of grinding the back of the wafer, the grinding tape is removed. To remove the grinding tape, a second tape is applied to the grinding tape. A roller is used to roll the second tape against the grinding tape to get good adhesion. Then the second tape is removed and the grinding tape comes off the with the second tape.

Particles of the grinding tape adhesive may adhere to the surface of the wafer, particularly at the edges of etching of the passivation layer. These tape particles can interfere with subsequent processing steps. In particular, metal bonding pads are formed along the edges of the chip, and the adhesive can stick to the surface of the pads and interfere with later process steps in which wires are bonded to the pads.

SUMMARY OF THE INVENTION

We have found that the probable reason the adhesive on the grinding tape adheres to the wafer is that the plastic adhesive is pressed into the groove where the passivation layer has been etched. We have also found that the adhesive of the grinding tape is cut by sharp edges where the surface of the wafer intersects with the walls of grooves etched in the passivation layer. These sharp edges are formed when the grooves are etched anisotropically and have nearly flat vertical walls. The etch is called anisotropic because it acts preferentially in one direction; it can maker the hole relatively deep without at the same time making the hole wide.

We think that the particles tear away from the backing when the tape is pealed away from the wafer and then adhere to the surface of the wafer.

According to one feature of this invention, the passivation etch is performed in a way that makes the edges beveled or rounded. More specifically they are given a concave bevel. The beveled edges are less likely. to cut into the adhesive tape and the adhesive is readily removed as the tape is pealed away from the wafer back.

We achieve this shape by combining the conventional anisotropic etch with an isotropic etch that rounds the edges. The isotropic etch proceeds substantially equally in all directions and thus enlarges the groove at the otherwise sharp corners.

The Prior Art

Lin U.S. Pat. No. 5,246,883 relates to a problem associated with via holes in a semiconductor device. If these holes have sharp corners, a mezal layer formed over the structure is thinner at these sharp edges. FIGS. 1 and 2 show a prior method in which a hole is formed through layers 4, 3 and 2 (from top to bottom). The upper layer 4 has a faster etch rate than the next layer 3 and an isotropic etch partly through layer 4 produces a depression with a rounded lower edge. Thereafter, an isotropic etch is formed Through the remainder of layer 4 and through. layers 3 and 2. The upper layer has concave edges that are sharp at the upper surface of layer 4 and at the beginning of the anisotropic etch.

In FIGS. 3–7 of Lin, a via hole with rounded edges is formed through layers 22, 20, 18 and 16 (from top to bottom). The upper layer 22 has a faster etch rate than the next layer 22, and an isotropic etch causes rounding at the upper edges. Thereafter an isotropic etch completes the hole through layers 18, and 16.

THE DRAWING

THE PREFERRED EMBODIMENT

Figure 1:
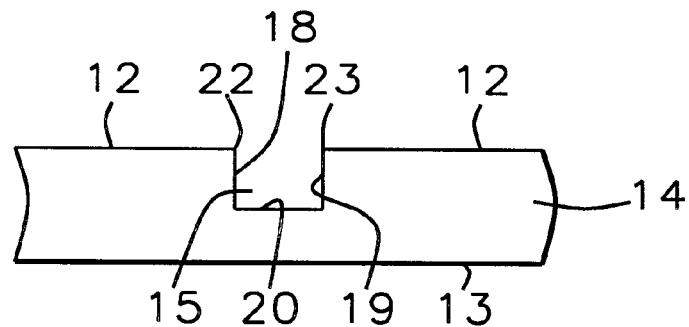
FIG. 1 is a section view of a wafer showing a passivation layer etch formed according to the prior art and according to one step in the method of this invention.

The Anisotropic Etch—FIG. 1

FIG. 1 shows the device surface 12 and the back surface 13 of a semiconductor wafer 14. An etched region 15, which will be called groove, is formed at surface 12. Ordinarily, the uppermost layer of the wafer for this step will be a passivation layer but from a more general standpoint the groove is formed in the uppermost layer of the wafer.

Groove 15 is approximately square or rectangular in the simplified section view of FIG. 1. The groove has side walls 18, 19 and a bottom wall 20. These walls are substantially flat and are sufficiently vertical to form two sharp edges 22 and 23 where they intersect with the upper surface 12 of the wafer 14.

The vertical walls 18 and 19 and the associated sharp edges 22 and 23 are attributable to the fact that this etch step is anisotropic: the etch proceeds almost entirely in the vertical direction of the wafer (in the orientation of FIG. 1) and it has little effect laterally.

The etching step illustrated in FIG. 1 is conventional and can be performed in any suitable way. As already explained, the sharp edges 22 and 23 interfere with the later conventional step of using. an adhesive tape to protect device surface 12 during the step of grinding back surface 13.

Figure 2:
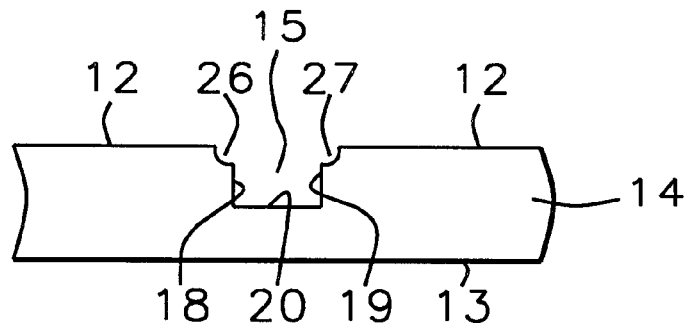
FIG. 2 is a view similar to FIG. 1 showing the improved passivation layer etch line of this invention.

The Isotropic Etch—FIGS. 1 and 2

In the improved method of this invention, the conventional process steps represented by the wafer of FIG. 1 are performed and after these steps the etch has the sharp edges 22, 23 shown in FIG. 1. Then, the sharp edges 22 and 23 are removed to produce the beveled or rounded edges 26 and.27 that are shown in FIG. 2.

Preferably, the beveled edges 26 and 27 are formed by an isotropic etch. The isotropic etch is well known and can be performed in any suitable way. Because it operates substantially equally in all directions, it widens the groove and thereby rounds the edges sufficiently to prevent them from cutting into the adhesive of the grinding tape. The rounded edges 26, 27 have the concave shape shown in FIG. 2.

Other Steps

The conventional steps of applying the grinding tape and grinding the back of the wafer are then performed. Because the uppermost surface of the wafer does not have sharp edges that could cut into the adhesive of the grinding tape, the adhesive is not separated from the backing and it is removed when the grinding tape and the second tape are removed. The wafer is free of this source of contamination that would interfere with bonding to the pads on the wafer.

Summary

From the description of our preferred method for forming a passivation layer etch and from the extensive background information that has been developed in this art, those skilled in the art of semiconductor manufacturing will recognize suitable modifications within the intended scope of the claims.

What is claimed is:

1. A method for processing a semiconductor wafer having a device surface and a back surface, the method comprising, etching the device surface with an anisotropic etch to form a groove with substantially vertical side walls and sharp edges where the side walls meet the device surface of the wafer, etching the device surface with an isotropic etch to form rounded edges where the edges were previously sharp, and after the etching steps, applying a grinding tape to the device surface of the wafer to protect the device side of the wafer during a subsequent step of grinding the back of the wafer, the grinding tape having an adhesive layer formed on a backing layer, and then grinding the back surface of the wafer to give the wafer a selected thickness, and removing the grinding tape and avoiding a residue of adhesive that would otherwise occur when sharp etched edges of the passivation layer cut into the adhesive layer of the grinding tape.

2. The method of claim 1 wherein the step of removing the grinding tape comprises applying a second adhesive tape to the grinding tape and using a roller to obtain good adhesion between the two adhesive tapes, the step of rolling the second tape tending to force the adhesive layer of the grinding tape into the groove etched in the device surface of the wafer, and using the second tape to remove the grinding tape.

3. The method of claim 2 wherein the anisotropic etch step is performed before the isotropic etch step.

4. The method of claim 3 including the preliminary step of forming a passivation layer in the device surface of the wafer and thereafter forming the anisotropic etch and the isotropic etch.

5. The method of claim 4 wherein the isotropic etch step is performed to give concave edges to the previously sharp edges.

6. A method for processing a semiconductor wafer having a device surface and a back surface, the method comprising, etching the device surface with an anisotropic etch to form a groove with substantially vertical side walls and sharp edges where the side walls meet the device surface of the wafer, rounding the previously sharp edges, applying a grinding tape to the device surface of the wafer to protect the device side of the wafer during a subsequent step of grinding the back of the wafer, the grinding tape having an adhesive layer formed on a backing layer, and then grinding the back surface of the wafer to give the wafer a selected thickness, applying a second adhesive tape to the grinding tape and using a roller to obtain good adhesion between the two adhesive tapes, the step of rolling the second tape tending to force the adhesive layer of the grinding tape into the groove etched in the device surface of the wafer, and using the second tape to remove the grinding tape and avoiding a residue that would otherwise occur when sharp etched edges of the passivation layer cut into the adhesive layer of the grinding tape during the rolling step.

7. The method of claim 6 wherein the step of rounding the previously sharp edges comprises performing an isotropic etch to round the edges.

* * * * *